United States Patent [19]

Omand

[11] Patent Number: 4,660,281
[45] Date of Patent: Apr. 28, 1987

[54] COMPONENT EXTRACTING TOOL

[76] Inventor: Richard C. Omand, Rte. 202A, Bow Lake, Strafford, N.H. 03884

[21] Appl. No.: 745,602

[22] Filed: Jun. 17, 1985

[51] Int. Cl.⁴ .............................................. H05K 3/30
[52] U.S. Cl. ....................................... 29/764; 29/758
[58] Field of Search .................. 29/741, 764, 278, 758

[56] References Cited

U.S. PATENT DOCUMENTS

| | | | |
|---|---|---|---|
| 3,699,629 | 10/1972 | Hood, Jr. et al. | 29/764 |
| 3,757,406 | 9/1973 | Bezar | 29/764 X |
| 3,974,556 | 8/1976 | Kubik | 29/764 |
| 3,990,863 | 11/1976 | Palmer | 29/764 |
| 4,392,301 | 7/1983 | Hannes et al. | 29/764 X |
| 4,521,959 | 6/1985 | Sprenkle | 29/764 X |
| 4,583,287 | 4/1986 | McDevett et al. | 29/764 X |

FOREIGN PATENT DOCUMENTS 2745966  4/1979  Fed. Rep. of Germany ........ 29/764

*Primary Examiner*—Carl E. Hall
*Attorney, Agent, or Firm*—Daniel H. Kane, Jr.

[57] ABSTRACT

A component extracting tool extracts larger electronic components and components difficult to remove from a circuit board such as pin grid array type electronic components, hybrid components and daughter boards. The tool is constructed with compressable and releasable handles which are compressable through first and second stages of tool action. Opposing grasping elements are operatively coupled to the handles for movement of the opposing grasping elements toward each other for grasping a component to be extracted upon initially compressing the handles through the first stage of tool action. Bracing elements abut against the circuit board from which a component is to be extracted and the bracing elements and grasping elements are mounted on the handles for extending and retracting movement relative to each other. A puller element is operatively coupled relative to the grasping and bracing elements for retracting movement of the grasping elements relative to the bracing elements upon further compressing the handles through the second stage of tool action for extracting and removing the component. A pushing element operatively returns the grasping elements and bracing elements to an original position relative to each other upon release of the handles.

19 Claims, 6 Drawing Figures

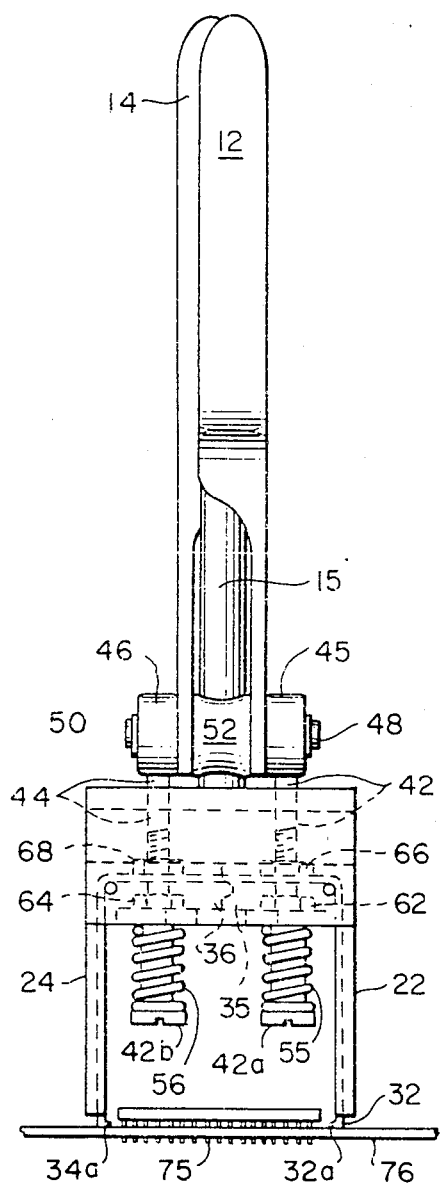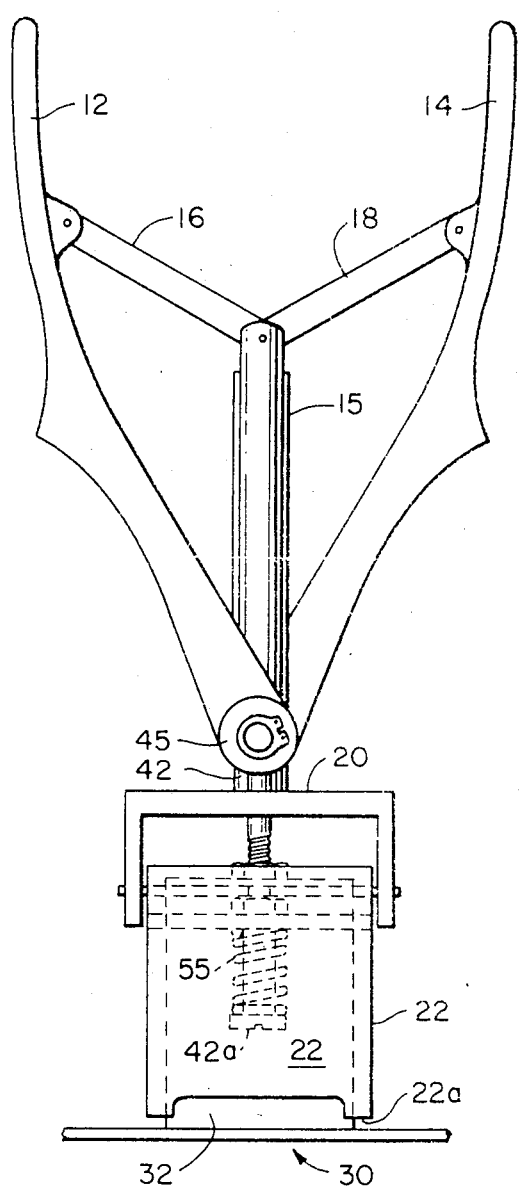
FIG. 1
FIG. 2

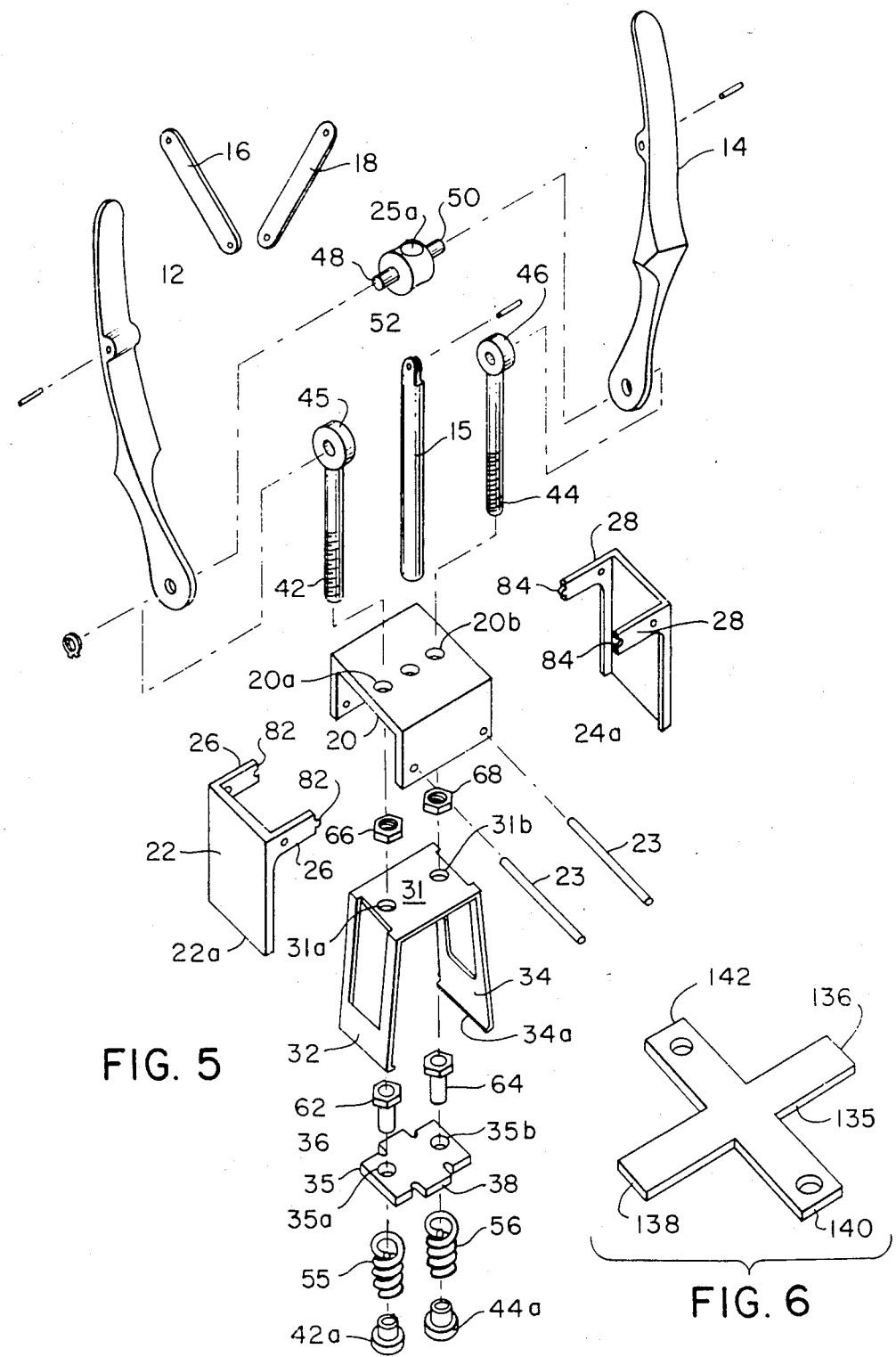

4,660,281

COMPONENT EXTRACTING TOOL

TECHNICAL FIELD

This invention relates to a new component extracting tool for extracting and removing electronic components and parts from a circuit board or other baseboard. The invention is particularly useful for extracting and removing larger electronic components and parts or components which are difficult to remove from the circuit board such as components of the pin grid array type, hybrid components, and daughter boards.

BACKGROUND ART

Larger electronic components and parts of the pin grid array configuration are fitted with an array of for example 132 pins for insertion or mounting in a corresponding pin grid array socket base incorporated in a circuit board or other baseboard. Because of the secure frictional fit such pin grid array components cannot be grasped and removed by hand. According to the conventional removal procedure a screwdriver is used to pry up the side of the component and loosen it for subsequent grasping and removal. A disadvantage of this current method is that the insertion and prying action of the screwdriver or other tool may damage the component, the circuit board or both. Furthermore the angle introduced between the component and circuit board caused by prying up one side of the component also results in potential damage to the pins and socket. Other larger electronic parts and components such as hybrid components mounted on a circuit board and "daughter" boards mounted on a "mother" board, found for example in microprocessor-based computers, may present similar problems.

OBJECTS OF THE INVENTION

It is therefore an object of the present invention to provide a new hand operated component extracting tool for careful and precise removal of electronic parts and components mounted on circuit boards or other baseboards without damage to either the components or the circuit boards. The invention is particularly intended for the safe extraction and removal of larger electronic components and parts and electronic components which are difficult to remove such as pin grid array mounted components, hybrid components and daughter boards.

Another object of the invention is to provide an extractor tool for extracting and removing electronic components from a circuit board in an attitude and orientation which remains parallel with the circuit board thereby eliminating potential damage caused by introducing an angle between the component and the circuit board during extraction.

A further object of the invention is to provide a component extracting tool which extracts and removes electronic components from a circuit board in a two-stage motion, first securely and squarely grasping the component and second withdrawing the component in parallel orientation from the circuit board while bracing against the circuit board at sufficient points of contact to maintain the parallel attitude relationship.

DISCLOSURE OF THE INVENTION

In order to accomplish these results the present invention provides a component extracting tool with compressable and releasable handles which are compressable through first and second stages of tool action. A grasping extractor with opposing grasping elements is operatively coupled to the handles for movement of the opposing grasping elements toward and away from each other. Upon initially compressing the handles through the first stage of tool action, the opposing grasping elements move toward each other for grasping a component to be extracted. Bracing fingers are also provided for abutting against a board from which the component is to extracted. The bracing fingers and grasping extractor are mounted on the handle for extending and retracting movement relative to each other. The operative coupling of the bracing fingers and grasping extractor results in retracting movement of the grasping elements relative to the bracing fingers upon further compressing the handles through the second stage of tool action.

A feature and advantage of this arrangement is that the grasping elements squarely and securely grasp the electronic component along at least two opposite sides while the bracing fingers abutting against the circuit board assure the continuing parallel attitude of the electronic component relative to the circuit board during grasping, extraction and removal. Thereafter, compression springs operatively coupled relative to the grasping elements and bracing fingers return the grasping elements and bracing fingers to a starting position relative to each other upon release of the handles.

According to the invention the tool is constructed with a yoke support or clevis mounted on a thrust rod in turn slideably mounted through the end of the handles for extension and retraction. A pair of opposing flat fingers arranged with flat tips or ends for abutting against a board are pivotally mounted to the yoke or clevis on opposite sides spaced apart a distance substantially commensurate with the width of components to be extracted. The flat fingers are formed with torque arms extending from the base of the fingers on opposite sides of the yoke toward each other. The extractor which may comprise for example a "U" shaped leaf spring formed with an extractor base and extending grasping elements is mounted within the facing sides of the flat fingers for extending and retracting movement relative to the flat fingers. The ends of the grasping elements of the U-shaped leaf spring are movable toward and away from each other for grasping and releasing components to be extracted.

In order to move the grasping elements toward each other, a pivot pusher is slideably mounted on connector rods extending from the end of the handles through the yoke support and extractor base. The pivot pusher bears against the ends of the torque arms extending toward each other from the bases of the flat fingers. Upon initially compressing the handles through the first stage of tool action the yoke is thrust or extended from the handle so that the pivot pusher applies force on the torque arms of the flat fingers tilting the flat fingers and therefore the grasping elements of the extractor toward each other for grasping a component.

Other features of the tool construction include puller nuts or washers fixably mounted on the connector rods for engaging the extractor base on the side away from the handle and retracting the extractor relative to the flat fingers for withdrawing or removing a component from the circuit board. A return nut or washer fixably mounted on the connector rods on the other side of the extractor base engage the extractor on the same side of the handle and push return the extractor to an initial starting position relative to the flat fingers upon release of the handles. Return is facilitated by compression springs mounted on the connector rods which return the yoke or clevis mounted on the thrust rod to a starting position with the yoke closer to the handle.

In summary, upon compressing the handles through the first stage the pivot pusher is constrained against the ends of the torque arms tilting the flat fingers inward which in turn move the grasping elements of the extractor toward each other for grasping an electronic component to be extracted. The handles are further compressable through the second stage of tool action so that the puller nuts or washers engage the extractor for relative retracting movement of the extractor within the flat fingers for extracting a component in parallel relationship from the board. The compression springs and return nuts or washers operatively return the extractor and flat fingers to the original starting relative position upon release of the handles.

Other objects, features and advantages of the invention are apparent in the following specification and accompanying drawings.

BRIEF DESCRIPTION OF THE DRAWINGS

FIG. 1 is a front view and FIG. 2 is a side view of the Component Extracting Tool in starting position with the handles open, the yoke or clevis retracted, and compression springs extended prior to grasping an electronic component to be extracted and removed.

FIG. 5 is an exploded diagrammatic perspective view showing the respective parts of the component extracting tool.

FIG. 6 is a plan view of an alternative torque or pivot pusher in the configuration of a bar rather than a plate for bearing against the torque arms of the flat fingers for tilting the flat fingers toward each other.

DESCRIPTION OF PREFERRED EXAMPLE EMBODIMENTS AND BEST MODE OF THE INVENTION

Figure 3:
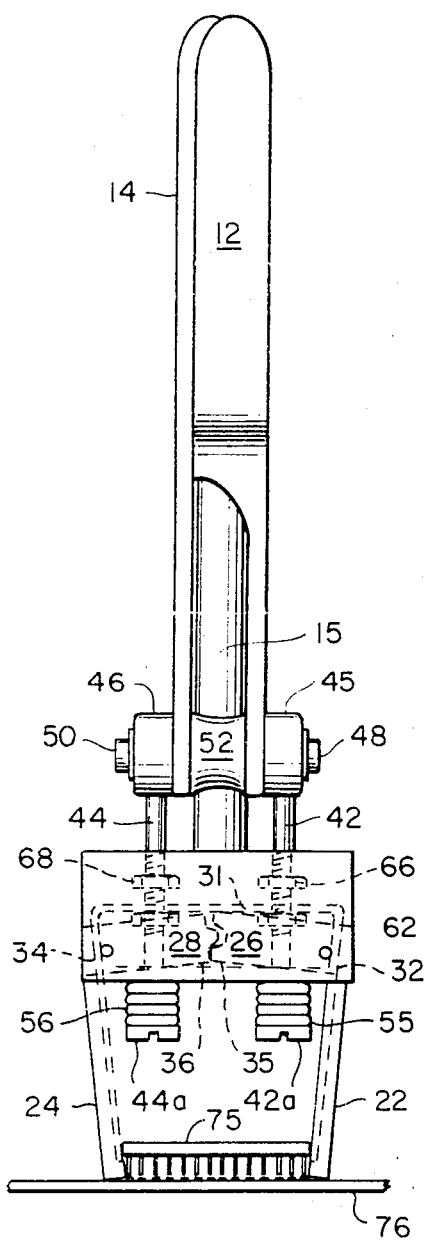
FIG. 3 is a front view and FIG. 4 is a side view of the Component Extracting Tool with the handles fully compressed, yoke or clevis extended, and compression springs compressed showing an electronic component which has been grasped and extracted or removed from a circuit board by the tool.

Referring to FIGS. 1, 2 and 5 the component extracting tool for extracting electronic components from circuit boards or baseboards includes a pair of compressable and releasable handles 12 and 14, a thrust rod 15 slideably mounted through the end of the handles for extension and retraction, and lever arms 16 and 18 operatively coupled between the handles 12 and 14 and the thrust rod 15 for extending and retracting the thrust rod. A clevis or yoke 20 is mounted on the outer end of thrust rod 15. A pair of flat fingers 22 and 24 with flat tips or ends 22a and 24a for abutting against a circuit board or baseboard are pivotally mounted on pivot axles or rods 23 to the yoke 20 on opposite sides and spaced apart a distance substantially commensurate with the width of components to be extracted. Torque arms 26 extend from the base of flat finger 22 while torque arms 28 extend from the base of flat finger 24. The respective torque arms 26 and 28 extend from opposite sides of the yoke or clevis 20 toward each other substantially abutting at the ends.

The extractor 30 provided, for example by a U-shaped leaf spring of flexible steel includes an extractor base 31 and grasping arms or elements 32 and 34. The extractor 30 is mounted within the flat fingers 22 and 24 for sliding extending and retracting movement relative to the flat fingers against the facing sides or insides of the flat fingers 22 and 24 which define channels for receiving the grasping elements 32 and 34 of the extractor 30.

An important operative part or element of the Component Extracting Tool is the pivot pusher 35 in the configuration of a plate with central arm extensions 36 and 38 which bear or abut respectively against the ends of the torque arms 26 and 28 of flat fingers 22 and 24. The pivot pusher plate extensions 36 and 38 are constrained against the abutting ends of the torque arms 26 and 28 for tilting flat fingers 22 and 24 and grasping elements 32 and 34 toward each other as hereafter described.

Extending from the end of the handles in fixed relationship to the handles 12 and 14 are a pair of connecting rods 42 and 44 mounted and fixed to bushings 45 and 46 secured at the ends of the handles 12 and 14 on rods 48 and 50 extending from the handle cylinder 52 formed with central hole 52a through which the thrust rod 15 extends and retracts upon compression and release of the handles 12 and 14.

The connector rods 42 and 44 pass through aligned holes 20a and 20b, 31a and 31b, 35a and 35b formed in the base of the yoke 20, extractor base 31 and pivot pusher plate 35. The connector rods 42 and 44 are provided with respective heads 42a and 44a for mounting and constraining compression springs 55 and 56 on the ends of the connector rods between the respective heads 42a and 44a and the pivot pusher plate 35.

Fixably mounted or mounted in fixed position on the connector rods 42 and 44 are a pair of puller nuts, washers or projections 62 and 64 on the side of the extractor base 31 away from the handles and below the pivot pusher plate 35 for engaging the extractor on the side away from the handle when the yoke or clevis 20 is extended or thrust away from the handles upon compression of the handles through the second stage of tool action. By this expedient, the extractor is withdrawn relative to the flat fingers 22 and 24 or rather the flat fingers 22 and 24 are thrust forward or extended with the yoke 20 relative to the extractor 30 while the extractor is retained in position by the puller nuts or washers 62 and 64 for extracting and removing a component grasped by the grasping elements 32 and 34 of the extractor.

Return nuts or washers 66 and 68 are also fixably mounted or mounted in fixed position on the connector rods 42 and 44 on the other side of the extractor base 31 for engaging the extractor on the same side as the handles. The pusher nuts, washers or projections 66 and 68 cooperate with the compression springs 55 and 56 so that upon release of the handles 12 and 14 the compression springs 55 and 56 return or retract the yoke 20 to its starting position while the pusher nuts, washers or extensions 66 and 68 engage the extractor so that the extractor slideably extends relative to the flat fingers 22 and 24 returning to its original position.

Referring to FIG. 1 it is seen that the grasping elements 32 and 34 of the extractor 30 are formed with grasping edges 32a and 34a respectively formed by folding over the leaf spring steel at the very ends of the grasping elements. Upon compression of the handles 12 and 14 through the first stage of tool action the yoke or clevis 20 is thrust forward or away from the handles on thrust rod 15 so that compression springs 55 and 56 on connector rods 42 and 44 constrain the pusher plate 35 and in particular the extensions 36 and 38 of the pivot pusher plate 35 against the abutting ends of the torque arms 26 and 28 of flat fingers 22 and 24. As a result the pivotally mounted flat fingers 22 and 24 tilt inward toward each other at the same time bending or moving the grasping elements 32 and 34 toward each other so that the grasping edges 32a and 34a grasp the sides of an electronic component 75 in this instance illustrated by a pin grid array type component 75 mounted in a pin grid array socket of a circuit board or baseboard 76. The further operation of the tool is described with reference to FIGS. 3 and 4.

Figure 4:
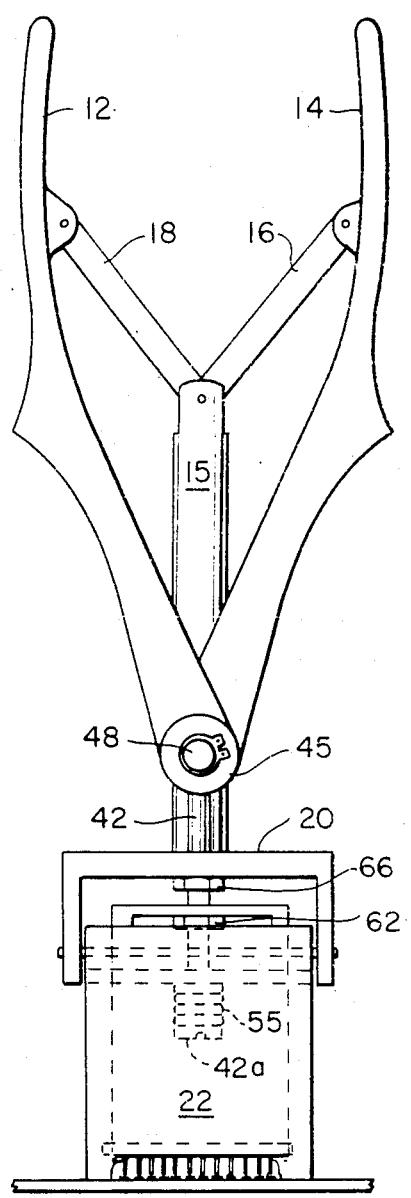

FIGS. 3 and 4 illustrate the configuration of the tool in the fully compressed condition after compressing the handles through the second stage of tool action. Upon such further compression of the handles, the yoke or clevis 20 on thrust rod 15 is thrust or extended forward to the full limit of movement, fully compressing the compression springs 55 and 56 mounted on the ends of the connector rods 42 and 44. During this full thrusting motion forward of the yoke 20 the puller nuts or washers 62 and 64 fixedly mounted on connector rods 42 and 44 engage the extractor base 31 retaining the extractor 30 in a fixed position at the pullers 62 and 64 relative to the handles 12 and 14. As a result the extractor and the extractor arms or grasping elements 32 and 34 are slideably withdrawn or retracted relative to the flat fingers 22 and 24 carefully and precisely withdrawing the pin grid array type electronic component 75 from its pin grid array socket in the circuit board 76.

As illustrated in FIG. 3, parallelism between the electronic component 75 and circuit board 76 is maintained throughout the two-stage tool action of grasping extraction and removal.

As shown in FIGS. 1-5, the abutting ends of the torque arms 26 and 28 of the pair of opposing flat fingers 22 and 24 are formed with respective intermeshing gear teeth 82 and 84. A feature and advantage of this arrangement is that the intermeshing gear teeth coordinate and equalize the tilting movement of the opposing flat fingers to assure the parallel attitude of the electronic component relative to the circuit board during grasping extraction and removal.

An alternative embodiment of the pivot pushing plate is illustrated in FIG. 6 where a pivot pusher bar 135 is substituted for the pivot pusher plate 35 as shown in FIG. 5. The pivot pusher bar 135 includes the extending pusher arms 136 and 138 which engage the abutting ends of the torque arms 26 and 28 of the pivotally mounted opposing flat fingers 22 and 24. The pivot pusher bar 135 is similarly mounted on the connecting rods 42 and 44 through the aligned holes 135a and 135b formed in the connecting rod mounting arms 140 and 142.

While the invention has been described with reference to particular example embodiments it is intended to cover all modifications and equivalents within the scope of the following claims.

I claim:

1. A component extracting tool for extracting a component from a board comprising:
   compressable and releasable handle means, said handle means being compressable through first and second stages;
   grasping means comprising opposing grasping elements operatively coupled to the handle means for movement of the opposing grasping elements toward each other for grasping a component to be extracted upon initially compressing the handle means through the first stage;
   and bracing means for abutting against a board from which a component is to be extracted, said bracing means and grasping means being mounted on the handle means for extending and retracting movement relative to each other, said bracing means and grasping means being operatively coupled to the handle means for retracting movement of the grasping means relative to the bracing means upon further compressing the handle means through the second stage;
   said bracing means comprising a yoke support operatively coupled to the handle means for extension and retraction of the yoke support upon compressing and releasing the handles and a pair of opposing flat fingers constructed and arranged with flat tips or ends for abutting against a board, said flat fingers being pivotally mounted to the yoke support on opposite sides and spaced apart to accommodate the width of components to be extracted, said flat fingers being formed with torque arms extending from the base of the fingers on opposite sides of the yoke support toward each other.

2. The tool of claim 1 comprising compression spring means operatively coupled between the grasping means and bracing means for returning said grasping means and bracing means to a starting position relative to each other upon release of the handle means.

3. The tool of claim 1 wherein the grasping means comprises extractor means formed with an extractor base and extending grasping elements, said extractor means being mounted within the facing sides or insides of the flat fingers for extending and retracting movement relative to the flat fingers, the ends of said grasping elements being movable toward and away from each other for grasping and releasing components to be extracted.

4. The tool of claim 3 wherein the extractor means comprises "U" shaped leaf spring means.

5. The tool of claim 3 further comprising:
   pivot pusher means abutting upon the ends of the torque arms extending toward each other from the bases of the flat fingers, said pivot pusher means being operatively coupled to the handle means for applying force on the torque arms for tilting the flat fingers toward each other upon initially compressing the handle means through the first stage thereby moving the grasping elements of the extractor means toward each other for grasping a component.

6. The tool of claim 5 wherein the opposing flat fingers are formed with the ends of the torque arms extending toward each other being substantially abutting, said ends being formed with intermeshing gear teeth for coordinated tilting movement of the opposing flat fingers.

7. The tool of claim 3 further comprising:
   connector rod means fixed to the handle means and extending from the handle means through the yoke support and the extractor base, said connector rod means formed with stop means at the end;
   puller means fixably mounted on the connector rod means on one side of the extractor base for engaging the extractor means on the side away from the handle means:

return means fixably mounted on the connector rod means on the other side of the extractor base for engaging the extractor means on the same side as the handle means;

pivot pusher means slideably mounted on the connector rod means and abutting upon the ends of the torque arms extending from the bases of the flat fingers.

8. The tool of claim 7 further comprising compression spring means operatively mounted and constrained between the stop means of the connector rod means and the pivot pusher means so that upon compressing the handle means through the first stage the pivot pusher means is constrained against the ends of the torque arms tiliting the flat fingers inward which in turn moves the grasping elements of the extractor means toward each other for grasping a component to be extracted, said handle means being compressable through the second stage so that the puller means engages the extractor means for relative retracting movement of the extractor means within the flat fingers for extracting a component from the board, said compression spring means and return means operatively returning the extractor means and flat fingers to the original starting relative position upon release of the handle means.

9. A component extracting tool for extracting a component from a board comprising:

a pair of compressable and releasable handles;

a clevis operatively coupled to the handles for extension and retraction of the clevis upon compressing and releasing the handles;

a pair of opposing flat fingers formed with flat ends for abutting against a board, said opposing flat fingers being pivotally mounted to the clevis on opposite sides and spaced apart to accommodate the width of components to be extracted, said flat fingers being formed with torque arms extending from the base of the fingers on opposite sides of the clevis toward each other;

extractor means comprising an extractor base and extending grasping elements, said extractor means being mounted within the flat fingers with the grasping elements abutting against the facing sides or insides of the flat fingers for extending and retracting movement relative to the flat fingers, the ends of said grasping elements being movable toward and away from each other for grasping and releasing components to be extracted;

connector rod means fixed to the handles and extending from the handles through the clevis and the extractor base, said connector rod means being formed with a head or stop edge at the end;

puller means fixably mounted on the connector rod means on one side of the extractor base from engaging the extractor means on the side away from the handles for retracting movement of the extractor means relative to the flat fingers;

return means fixably mounted on the connector rod means on the other side of the extractor base for engaging the extractor means on the same side as the handles for extending movement of the extractor means relative to the flat fingers for return to a starting position;

pivot pusher means slideably mounted on the connector rod means and abutting upon the ends of the torque arms extending toward each other from the bases of the flat fingers;

compression spring means mounted and constrained between the head or stop edge of the connector rod means and the pivot pusher means;

whereby upon compressing the handles, the pivot pusher means is constrained against the ends of the torque arms by the compression spring means thereby tilting the flat fingers inward and moving the grasping elements of the extractor means toward each other to engage and grasp a component to be extracted, and whereby upon further compressing the handles, the puller means engages and holds the extractor base for relative retracting movement of the extractor means within the flat fingers for extracting the component, said compression spring means and return means operatively returning the extractor means and flat fingers to the original or starting relative position upon release of the handles.

10. The tool of claim 9 wherein the opposing flat fingers are formed with the ends of the torque arms extending toward each other being substantially abutting and wherein said substantially abutting ends of the torque arms are formed with intermeshing gear teeth for coordinated tilting movement of the flat fingers.

11. The tool of claim 9 wherein the extractor means comprises a "U" shaped leaf spring with gripping edges formed at the ends of the arms of the "U" and wherein the arms of the "U" comprise the grasping elements.

12. The tool of claim 9 wherein the flat fingers define guide channels for sliding movement of the arms of the "U" shaped leaf spring in the guide channels.

13. The tool of claim 9 wherein the handles comprise a thrust rod slideably mounted through the end of the handles for extension and retraction, and lever arms operatively coupled between the handles and the thrust rod for extending and retracting the thrust rod, said clevis being mounted on the thrust rod.

14. The tool of claim 13 wherein the connecting rod means comprises first and second connecting rods extending in fixed position in parallel from the end of the handles, each connecting rod being formed with a head or stop edge at the end, said compression spring means comprising first and second compression springs one mounted on each connecting rod.

15. The tool of claim 14 wherein the pivot pusher means comprises a bar element slideably mounted on the first and second connecting rods.

16. The tool of claim 14 wherein the pivot pusher means comprises a plate slideably mounted on the first and second connecting rods.

17. A component extracting tool for extracting a component from a board comprising:

compressable and releasable handle means, said handle means being compressable through first and second stages;

grasping means comprising opposing grasping elements operatively coupled to the handle means for movement of the opposing grasping elements toward each other for grasping a component to be extracted upon initially compressing the handle means through the first stage;

bracing means for abutting against a board from which a component is to be extracted, said bracing means and grasping means being mounted on the handle means for extending and retracting movement relative to each other;

pulling means operatively coupled relative to the grasping means and bracing means for retracting movement of the grasping means relative to the bracing means upon further compressing the handle means through the second stage;

and pushing means operatively coupled to the handle means, grasping means, and bracing means for extending movement of the grasping means relative to the bracing means for return to an original position upon release of the handle means;

said bracing means comprising a yoke support operatively coupled to the handle means for extension and retraction of the yoke support upon compressing and releasing the handles, and a pair of opposing flat fingers constructed and arranged with flat tips or ends for abutting against a board, said flat fingers being pivotally mounted to the yoke support on opposite sides and spaced apart a distance to accommodate the width of components to be extracted, said flat fingers being formed with torque arms extending from the base of the fingers on opposite sides of the yoke support toward each other;

pivot pusher means abutting upon the ends of the torque arms extending toward each other from the bases of the flat fingers, said pivot pusher means being operatively coupled to the handle means for applying force on the torque arms for tilting the flat fingers toward each other upon initially compressing the handle means through the first stage thereby moving the grasping elements of the extractor means toward each other for grasping a component.

18. The tool of claim 17 wherein said pushing means comprises compression spring means operatively coupled relative to the handle means, grasping means and bracing means.

19. The tool of claim 17 wherein said pushing means comprises compression spring means operatively coupled between the handle means and bracing means and a pusher operatively coupled between the handle means and grasping means for returning the grasping means and bracing means to an original position relative to each other upon releasing the handle means.

* * * * *